(12) United States Patent
Yasuda et al.

(10) Patent No.: US 7,312,682 B2
(45) Date of Patent: Dec. 25, 2007

(54) COIL COMPONENT AND ELECTRONIC DEVICE

(75) Inventors: Masatoshi Yasuda, Tokyo (JP); Shin Kudo, Tokyo (JP); Hiroshi Suzuki, Tokyo (JP); Katsumi Kobayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/434,845

(22) Filed: May 17, 2006

(65) Prior Publication Data

US 2006/0267719 A1 Nov. 30, 2006

(30) Foreign Application Priority Data

May 27, 2005 (JP) .......................... P2005-155704
Apr. 26, 2006 (JP) .......................... P2006-122359

(51) Int. Cl.
*H01F 5/00* (2006.01)
(52) U.S. Cl. .................. 336/200; 336/83; 336/232
(58) Field of Classification Search ................ 336/83, 336/200, 223, 232
See application file for complete search history.

(56) References Cited

U.S. PATENT DOCUMENTS

| | | | |
|---|---|---|---|
| 3,585,553 A | 6/1971 | Muckelroy et al. | |
| 4,926,151 A * | 5/1990 | Morinaga ................... | 335/296 |
| 6,154,112 A * | 11/2000 | Aoba et al. ................. | 336/192 |
| 6,472,969 B1 * | 10/2002 | Hanato ........................ | 336/192 |
| 6,717,500 B2 | 4/2004 | Girbachi et al. | |
| 2002/0084878 A1 | 7/2002 | Kimura et al. | |
| 2004/0263285 A1 | 12/2004 | Suzuki et al. | |
| 2006/0071749 A1 * | 4/2006 | Aoki et al. ................... | 336/83 |

FOREIGN PATENT DOCUMENTS

| | | |
|---|---|---|
| DE | 1 783 767 | 2/1959 |
| DE | 86 20 265 | 11/1986 |
| DE | 38 42 878 C2 | 6/1989 |
| DE | 197 00 709 C2 | 7/1997 |
| DE | 197 20 394 C2 | 11/1997 |
| DE | 101 11 789 A1 | 9/2001 |
| EP | 0 130 902 | 1/1985 |
| JP | A-11-204346 | 7/1999 |
| JP | A-2002-033228 | 1/2002 |
| JP | A-2003-077730 | 3/2003 |
| JP | A-2003-234218 | 8/2003 |
| JP | A-2004-179314 | 6/2004 |
| JP | A-2005-322688 | 11/2005 |

\* cited by examiner

*Primary Examiner*—Anh Mai
(74) *Attorney, Agent, or Firm*—Oliff & Berridge, PLC

(57) ABSTRACT

A coil component comprises a core element having a mounting portion, a coil conductor placed on the core element, and at least two terminal electrodes which are placed in the mounting portion. The mounting portion has at least two terminal placement areas for placing the terminal electrodes respectively. A hollow portion opening to the mounting side face of the mounting portion is formed in an area between the at least two terminal placement areas in the mounting portion. When mounting the coil component on a circuit board, conductive paste is intervened between an area from the terminal electrodes placed in the mounting portion of the core element to the base exposed area of the mounting portion, and the electrode patterns on the circuit board.

12 Claims, 18 Drawing Sheets

COIL COMPONENT AND ELECTRONIC DEVICE

BACKGROUND OF THE INVENTION

1. Field of the Invention

The present invention relates to a coil component and an electronic device.

2. Description of the Related Art

A known conventional coil component is a common mode choke coil disclosed in Japanese Patent Application Laid-Open No. 2003-77730, for example. The coil component disclosed in this document comprises a magnetic core having a core portion and a pair of flange portions disposed on both ends of the core portion, terminal electrodes, two of which are disposed on each flange of the magnetic core respectively, and two insulated coated conductors (coils) which are wound around the core portion of the magnetic core. In the electrode terminal portion, both ends of each insulated coated conductor are conductively connected respectively.

SUMMARY OF THE INVENTION

To mount this coil component on a circuit board, the terminal electrodes of the coil component are normally soldered to the electrode patterns formed on the circuit board. However in the case of mounting by soldering, high temperature heat may affect other components, which drops the reliability of the device. Considering the case when an electronic device having a coil component is mounted in an automobile, the mounting strength of the coil component to the circuit board must be sufficiently high.

It is an object of the present invention to provide a coil component and an electronic device for decreasing influence on other components when being mounted on a circuit board, and improving the mounting strength on the circuit board.

Recently conductive paste (e.g. silver paste) is being considered as an adhesive for low temperature mounting, instead of high temperature soldering. If conductive paste is used, mounting is possible at a very low temperature compared with solder mounting, which requires 240° C. or higher temperature. For example, conductive paste can be cured in about 30 minutes even if the temperature is 150° C.

When the coil component is mounted on a circuit board using such conductive paste, the terminal electrodes of the coil component are bonded to the electrode patterns formed on the circuit board by the conductive paste. If the surface of the terminal electrodes is smoother than the base surface of the core element, because of gold plating performed on the surface of the terminal electrodes, for example, the contact (adhesion) between the conductive paste and the terminal electrodes is worse than the contact between the conductive paste and the base of the core element. Therefore, in order to increase the mounting strength of the coil component on a circuit board, it is preferable to intervene conductive paste not only between the electrode patterns and terminal electrodes but also between the electrode patterns and the base of the core element.

If the conductive paste is intervened between the electrode patterns and the base of the core element, however, the following problems occur. In the state where the coil component is mounted on the circuit board, moisture contained in the atmosphere tends to be caught between the core element and the circuit board. If voltage is applied to each terminal electrode in this state where moisture is attached to the conductive paste, ion migration tends to occur because of electrolysis of the moisture. If ion migration occurs, metal dendrites may be generated between adjacent electrode patterns. If the distance between the adjacent electrode patterns is short, each electrode pattern is short circuited, which causes a dielectric breakdown. With the foregoing in view, it is an object of the present invention to solve such problems caused by mounting the coil component using conductive paste.

A coil component according to the present invention comprises a core element having a mounting portion, at least one coil conductor placed on the core element, and at least two terminal electrodes which are placed in the mounting portion and are electrically connected to at least one coil conductor, wherein the mounting portion has at least two terminal placement areas for placing at least two terminal electrodes, and a hollow portion, opening to the mounting side face of the mounting portion, is formed in an area between at least two terminal placement areas in the mounting portion.

To mount this coil component on a circuit board, conductive paste is intervened between an area from the terminal electrodes placed in the mounting portion of the core element to a base exposed area of the mounting portion, and the electrode patterns on the circuit board. By applying conductive paste not only on the terminal electrodes but also on the base exposed area of the mounting portion which has good contact (adhesion), the mounting strength of the coil component on the circuit board can be increased. By mounting the coil component on the circuit board using conductive paste, mounting at a sufficiently lower temperature than the case of mounting by solder becomes possible, so the influence of high temperature heat on other components on the circuit board can be decreased. At this time, intervening the conductive paste between the base exposed area of the mounting portion and the electrode patterns tends to cause ion migration if voltage is applied to each terminal electrode in a state where moisture is caught between the core element and the circuit board. If ion migration occurs, metal (e.g. silver) dendrites may be generated in the conductive paste between adjacent electrode patterns, as mentioned above. However in the area between each terminal electrode in the mounting portion, the hollow portion, opening to the mounting side face of the mounting portion, is formed, so the progress of forming dendrites is suppressed by the hollow portion. This can prevent short circuiting between each terminal electrode caused by ion migration. Therefore the coil component can be mounted on the circuit board by the conductive paste without problems.

Preferably, the core element further comprises a core portion fixed to the mounting portion, and the coil conductor is a coil wound around the core portion. By this, when the present invention is applied to a wire-wound type coil component, the mounting strength of the coil component on the circuit board can be increased, and the influence of the high temperature heat on other components on the circuit board can be decreased.

Preferably, when the length from the terminal electrode to the hollow portion is A and the width of the hollow portion is B in the mounting portion, the relationship $A/2 \leq B \leq A$ is satisfied. In this case, when voltage is applied to each terminal electrode, the progress of dendrites that could be generated between the adjacent electrode patterns can be suppressed with certainty, and the mounting strength of the coil component on the circuit board can be sufficiently secured.

Preferably, the height position of the mounting side face of the terminal placement area in the mounting portion is substantially higher than the height position of the mounting side face of an area between at least two terminal placement areas in the mounting portion by the thickness of the terminal electrode. In this case, the mounting side face of the area between the two terminal placement areas and the mounting side face of the terminal electrode in the mounting portion substantially form a same plane. Therefore, the coil component is stably fixed to the circuit board, and the mounting strength of the coil component on the circuit board can be sufficiently increased.

Preferably, the core element has a pair of flange portions positioned at both ends of the core portion, and the pair of flange portions constitute the mounting portion. In this case, the structure of the core element can be simplified, which is advantageous in terms of cost. Also by placing a flat core on the pair of flange portions, for example, the core element can have a closed magnetic circuit structure. By this, the leakage magnetic flux of the core element can be decreased, and the generation of noise can be suppressed.

Preferably, the core element further comprises a first core which has the core portion and a pair of flange portions positioned at both ends of the core portion, and a second core positioned in the first core so as to surround the first core, and the second core constitutes the mounting portion. In this case, the core element has a closed magnetic circuit structure. By this, the leakage of magnetic flux of the core element can be decreased, and the generation of noise can be suppressed.

Preferably, the core element has an upper flange portion and a lower flange portion, which are positioned at both ends of the core portion, and the lower flange portion constitutes the mounting portion. In this case, the structure of the core element can be simplified, which is advantageous in terms of cost.

Preferably, the terminal electrode is a terminal metal fitting which is attached in the terminal placement area of the mounting portion. In this case, the terminal electrode can be freely formed according to the shape and structure of the core element and coil conductor. Also the electrical connection of the coil conductor and terminal electrode can be performed by various means.

Preferably, the terminal electrode is a plated electrode formed on the surface of the terminal placement area of the mounting portion. In this case, the terminal electrodes can be formed to be sufficiently thin, so the mounting side face of the area between the two terminal formation areas and the mounting side face of the terminal electrode in the mounting portion can substantially form a same plane even if special processing is not performed on the core element.

An electronic device according to the present invention comprises a circuit board and a coil component which is mounted on the circuit board by conductive paste, wherein the coil component comprises a core element having a mounting portion, at least one coil conductor placed in the core element, and at least two terminal electrodes which are placed in the mounting portion and are electrically connected to at least one coil conductor, the mounting portion has at least two terminal placement areas for placing at least two terminal electrodes, and a hollow portion opening to the mounting side face of the mounting portion is formed in an area between at least two terminal placement areas in the mounting portion.

When this electrode device is fabricated, the coil component is mounted on the circuit board in a state where conductive paste is intervened between an area from the terminal electrodes placed in the mounting portion of the core element to a base exposed area of the mounting portion, and the electrode patterns on the circuit board. By applying the conductive paste not only to the terminal electrodes but also to the base exposed area of the mounting portion which has good contact (adhesion), the mounting strength of the coil component on the circuit board can be increased. By mounting the coil component on the circuit board using conductive paste, mounting at sufficiently low temperature than the case of mounting by solder becomes possible, so the influence of high temperature heat on other components on the circuit board can be decreased. At this time, intervening the conductive paste between the base exposed area of the mounting portion and the electrode patterns tends to cause ion migration if voltage is applied to each terminal metal fitting in a state where moisture is caught between the core element and circuit board. If ion migration occurs, metal (e.g. silver) dendrites may be generated in the conductive paste between adjacent electrode patterns, as mentioned above. However in the area between each terminal electrode in the mounting portion, the hollow portion, opening to the mounting side face of the mounting portion, is formed, so the progress of forming the dendrites is suppressed by the hollow portion. This can prevent short circuiting between each terminal electrode caused by ion migration. Therefore the coil component can be mounted on the circuit board by the conductive paste without problems.

According to the present invention, when the coil component is mounted on the circuit board by conductive paste, the generation of short circuiting between the terminal electrodes due to ion migration can be prevented, so no problems occur even if the coil component is mounted on the circuit board using conductive paste. Therefore the coil component need not be mounted on the circuit by high temperature soldering, so the influence on other components on the circuit board can be decreased. Also the conductive paste is applied to the terminal electrodes and mounting portion, so the mounting strength of the coil component on the circuit board can be increased. As a result, the reliability of the electronic device can be improved.

The present invention will become more fully understood from the detailed description given herein below and the accompanying drawings which are given by way of illustration only, and thus are not to be considered as limiting the present invention.

Further scope of applicability of the present invention will become apparent from the detailed description given hereinafter. However it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the present invention will now be described below in detail with reference to the accompanying drawings. In the description identical elements or elements with identical functionality will be denoted by the same reference symbols, without redundant description.

First Embodiment

Figure 1:
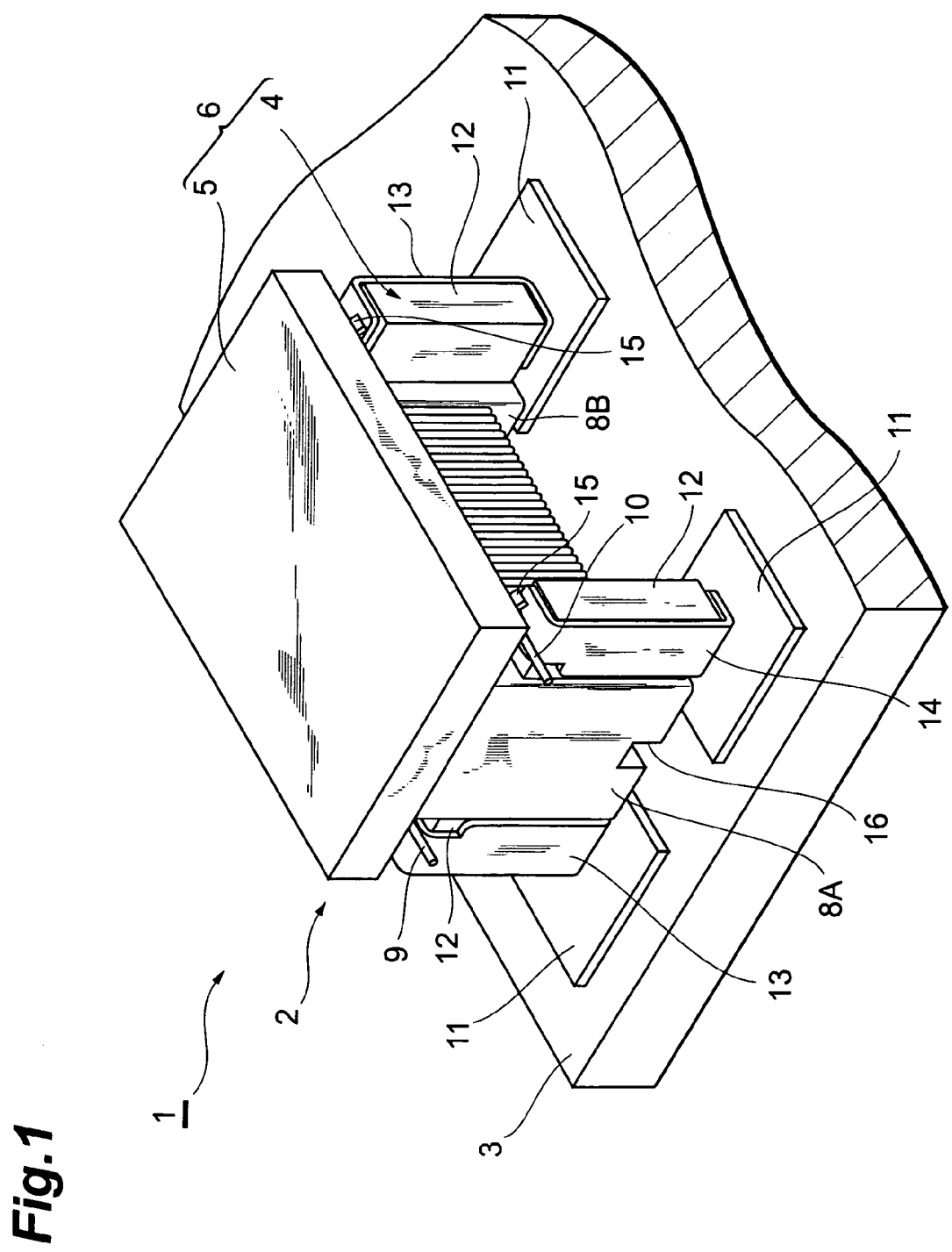
FIG. 1 is a perspective view depicting an electronic device according to the first embodiment.
Figure 2:
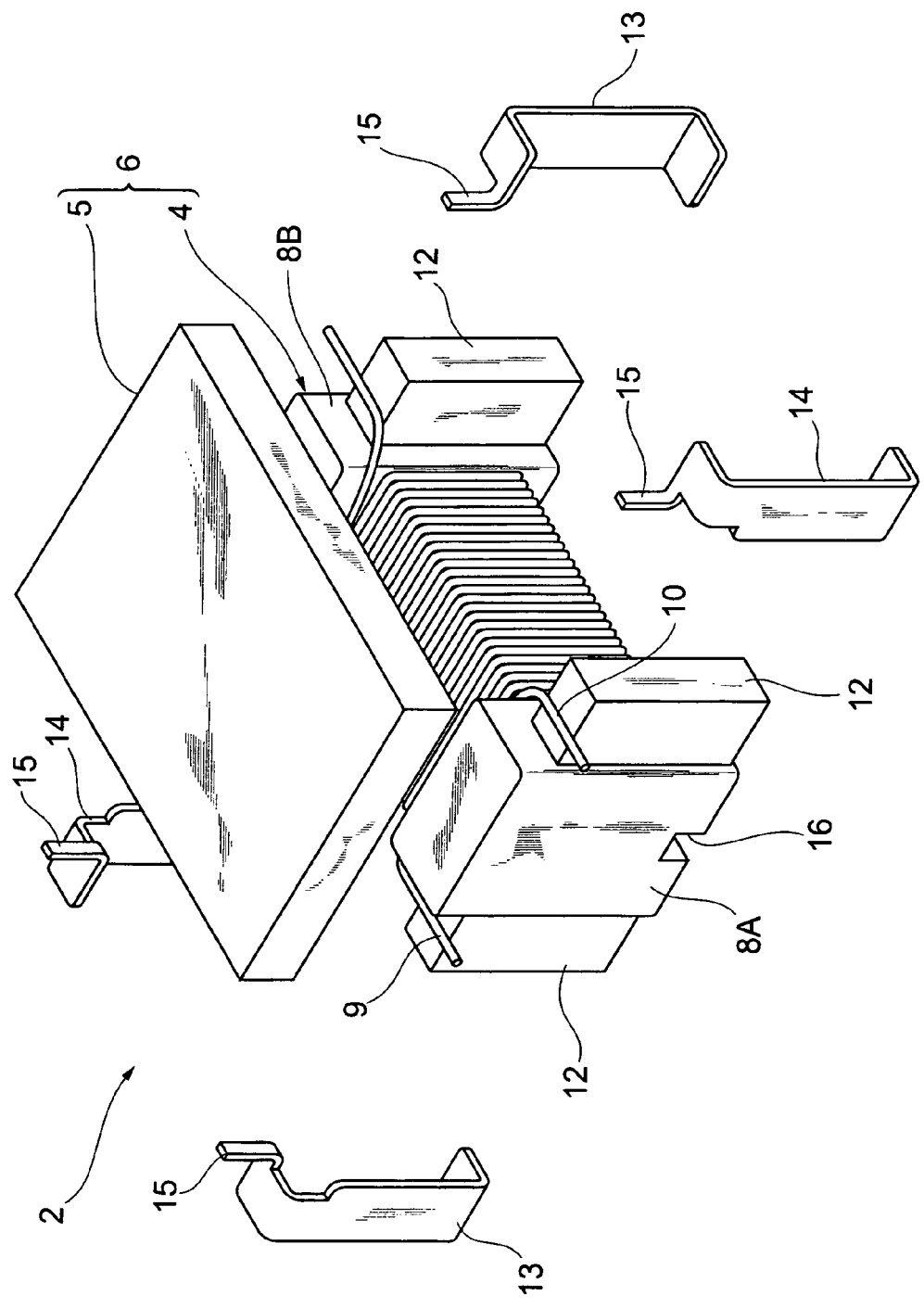
FIG. 2 is an exploded perspective view depicting the coil component shown in FIG. 1.
Figure 3:
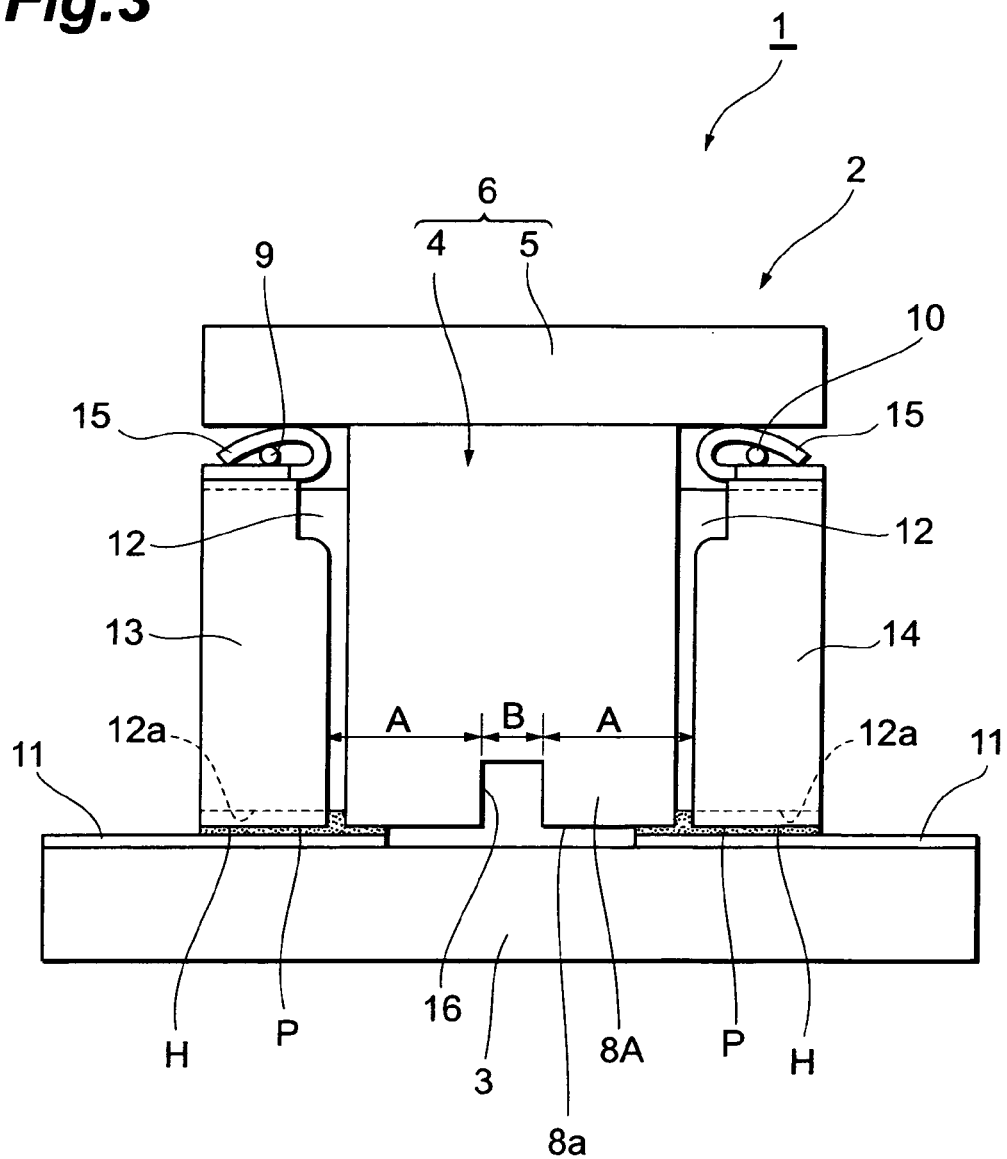
FIG. 3 is a side view depicting the electronic device shown in FIG. 1.

An electronic device 1 according to the first embodiment will be described first with reference to FIG. 1-FIG. 5. FIG. 1 is a perspective view depicting the electronic device according to the first embodiment. FIG. 2 is an exploded perspective view depicting the coil component shown in FIG. 1. FIG. 3 is a side view depicting the electronic device shown in FIG. 1. The electronic device 1 has a coil component 2. The coil component 2 is a common mode filter for a power supply line, for example. The coil component 2 is mounted on a circuit board 3 by conductive paste (Ag paste in this example) P. The coil component 2 comprises a core element 6 which has a drum core 4 and flat core 5. The core element 6 is made of a magnetic substance, such as ferrite, or a non-magnetic substance, such as ceramic. The coil component 2 is set, for example, to the length of about 4.5 mm, the width of about 3.2 mm, and the height of about 2.8 mm.

Figure 4:
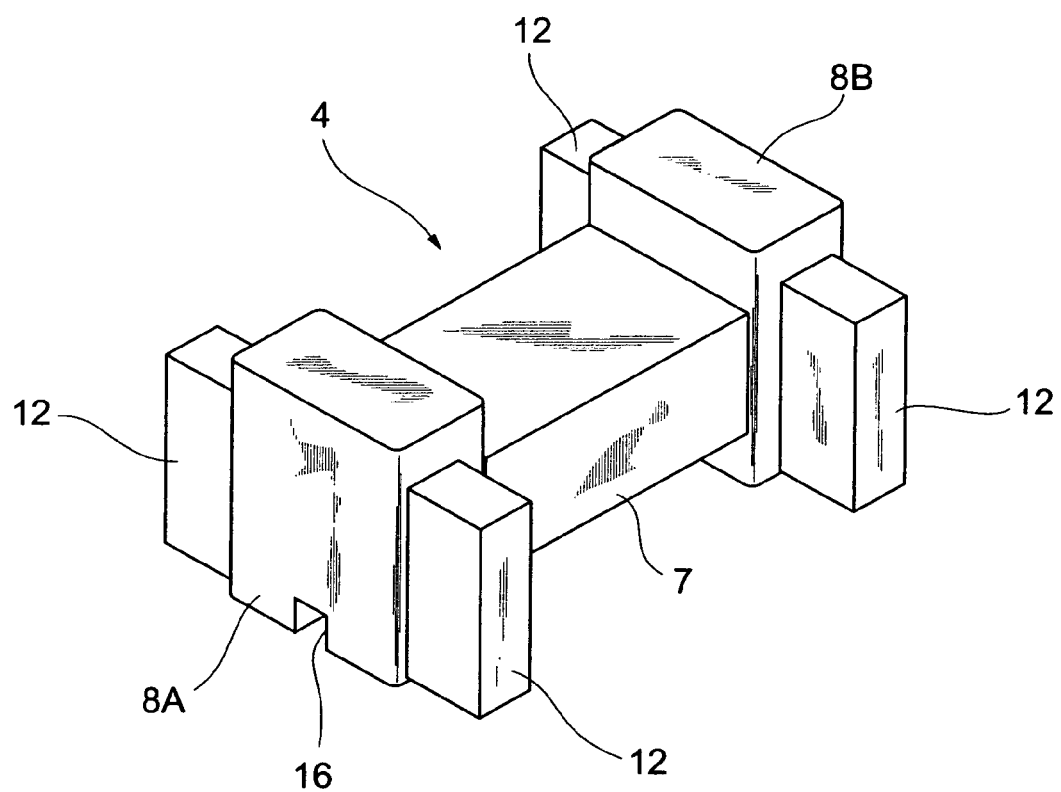
FIG. 4 is a perspective view depicting the drum core shown in FIG. 1.

The drum core 4 has a core portion 7, and a pair of flange portions 8A and 8B disposed on both ends of the core portion 7, as shown in FIG. 4. The core portion 7 and the flange portions 8A and 8B are integrated. The shape of the core portion 7 is roughly a quadrangular prism. The flange portions 8A and 8B are roughly a rectangular parallelepiped. In the core portion 7, two coils (conductors) 9 and 10 are placed. Each coil 9 and 10 is constituted by the conductor wound around the core portion 7. The coils 9 and 10 are electrically insulated from each other.

The flange portions 8A and 8B constitute the mounting portion, which is bonded to electrode patterns 11 formed on the circuit board 3. Each of the flange portions 8A and 8B has terminal forming areas 12 on both ends. On one terminal forming area 12 of the flange portion 8A and on one terminal forming area 12 on the flange portion 8B, a terminal metal fitting (terminal electrode) 13, which is electrically connected with both ends of the coil 9, is attached respectively. On the other terminal forming area 12 of the flange portion 8A and the other terminal forming area 12 of the flange portion 8B, a terminal metal fitting (terminal electrode) 14, which is electrically connected with both ends of the coil 10, is attached respectively.

The terminal metal fittings 13 and 14 roughly have a C-shaped cross-section, and are placed at each terminal forming area 12 of the flange portions 8A and 8B. The terminal metal fittings 13 and 14 are attached to the terminal forming area 12 by crimping the top face and bottom face of each terminal forming area 12 of the flange portions 8A and 8B from the outside. On the terminal metal fittings 13 and 14, connection pieces 15, for connecting both ends of the coils 9 and 10, are formed. In a state where both ends of the coils 9 and 10 are placed on the terminal metal fittings 13 and 14 respectively, the connection pieces 15 are bent from the standing position as shown in FIG. 2, so that both ends of the coils 9 and 10 are inserted therein, and the coils 9 and 10 are connected to the terminal metal fittings 13 and 14. At this time, a laser beam is irradiated onto both ends of the coils 9 and 10 and each connection piece 15, for example, to fuse and join the coils 9 and 10 and terminal metal fittings 13 and 14.

The terminal metal fittings 13 and 14 are merely fitted into the terminal forming areas 12 of the flange portions 8A and 8B, and are not fixed (not integrated). Therefore, even if there is a thermal expansion difference and a shrinkage difference due to the difference of the linear expansion coefficients between the terminal metal fittings 13 and 14 and conductive paste P, the terminal metal fittings 13 and 14 themselves shift with respect to the terminal forming areas 12, and the influence of the thermal expansion difference and shrinkage difference are absorbed. As a result, such damage as cracks on the electronic device 1 can be prevented. The terminal metal fittings 13 and 14 are formed by sequentially performing Ni plating and Au plating on a base made of phosphor bronze or an Ni alloy (42 alloy). Au plating is performed considering good compatibility with adhesive, such as conductive paste P. If 42 alloy is used as the base of the terminal metal fittings 13 and 14, the linear expansion difference from the Ag paste can be decreased. By using the terminal metal fittings 13 and 14 as the terminal electrodes, the terminal electrodes can be freely configured according to the structure of the core element 6, such as forming connection pieces 15. If 42 alloy is used as the base of the terminal metal fittings 13 and 14, the coils 9 and 10 can be easily connected using laser beams.

As FIG. 3 shows, it is preferable that the height position of the bottom face (mounting side efface) 12a of the terminal forming area 12 of the flange portion 8A and 8B is substantially higher than the height position 8a of the bottom face (mounting face) of the area between each terminal forming area 12 in the flange portions 8A and 8B by the thickness of the terminal metal fittings 13 and 14. By this, in a state where the terminal metal fittings 13 and 14 are attached to the terminal forming area 12, the bottom face 8a of the area between each terminal forming area 12 in the flange portions 8A and 8B and the bottom face (mounting face) H of the terminal metal fittings 13 and 14 substantially form a same plane.

At the bottom end of the area between each terminal forming area 12 in the flange portions 8A and 8B, a hollow portion 16, opening to the mounting face 8a, is formed. The hollow portion 16 extends in the longitudinal direction of the core portion 7, and is formed in a shape of a groove of which cross-section is a rectangle. The hollow portion 16 is formed at the center of the flange portions 8A and 8B so as to extend from the outer face to the inner face of the flange portions 8A and 8B. By this, the mounting face 8a of the flange portions 8A and 8B exists on both sides of the hollow portion 16. As FIG. 3 shows, when the length from the terminal metal fittings 13 and 14 to the hollow portion 16 is A and the width of the hollow portion 16 is B in the flange portions 8A and 8B, it is preferable to satisfy the relationship of $A/2 \leq B \leq A$. The length A from the terminal metal fittings 13 and 14 to the hollow portion 16 is about 0.7 mm, for example, and the width B of the hollow portion 16 is about 0.4 mm, for example. The depth of the hollow portion 16 is about 0.3 mm, for example.

The flat core 5 is secured on the top face of the above mentioned drum core 4 with adhesive. By placing the flat core 5 on the drum core 4, the core element 6 has a closed magnetic circuit structure. Because of this, the leakage magnetic flux of the core element 6 is decreased, so the impedance characteristic of the coil component 2 can be improved, and the generation of noise can be suppressed.

To fabricate the electronic device 1 having the above structure, the coil component 2 is mounted on the circuit board 3 in a state where the conductive paste P is intervened between an area covering the entire mounting face H of the terminal metal fittings 13 and 14 and a part of the mounting faces 8a of the flange portion 8A and 8B and the electrode patterns 11 as shown in FIG. 3.

The conductive paste P can be cured and adhered at sufficiently lower temperature (e.g. 150° C.) than solder and at a relatively short time (e.g. 30 minutes). By this, the breakdown and damage of other component on the circuit board 3 caused by the influence of high temperature heat can be prevented.

When Au plating has been performed on the surface of the terminal metal fittings 13 and 14, the adhesion (contact) between the terminal metal fittings 13 and 14 and the Ag paste P is not very strong. However the surface of the base of the drum core 4 is rough, so Ag paste P enters the bumpy surface of the base of the drum core 4 when Ag paste P is applied to the surface of the base of the drum core 4, and an anchor effect is generated. By this anchor effect, adhesion between the drum core 4 and the Ag paste P increases.

When the coil component 2 is mounted, Ag paste P is intervened not only between the terminal metal fittings 13 and 14 and the electrode patterns 11, but also between a part of the flange portions 8A and 8B and the electrode patterns 11. By this, the coil component 2 can be strongly bonded to the electrode patterns 11. Since the mounting face 8a of the flange portions 8A and 8B and the mounting face H of the terminal metal fittings 13 and 14 form a same plane, the coil component 2 and the electrode patterns 11 can be stably bonded.

When the coil component 2 is mounted on the circuit board 3 in a state where the Ag paste P is applied to the mounting faces 8a of the flange portions 8A and 8B, the dendrites of Ag may be generated between the flange portions 8A and 8B and the electrode patterns 11. The mechanism of generating the dendrites is as follows.

In the state where the coil component 2 is mounted on the circuit board 3, moisture absorbed from the atmosphere may exist between the flange portions 8A and 8B and the electrode patterns 11. If voltage is applied to each electrode pattern 11 in this state, the following ionization occurs.

$$Ag \rightarrow Ag^+$$

$$H_2O \rightarrow H^+ + OH^-$$

$Ag^+$ and $OH^-$ generate and precipitate AgOH at one of the two adjacent electrode patterns 11 (anode). AgOH is decomposed to be $Ag_2O$, and this $Ag_2O$ is dispersed as colloidal matter.

$$2AgOH \rightarrow Ag_2O = H_2O$$

Then by the hydration reaction of $Ag_2O + H_2O \rightarrow 2 AgOH \rightarrow 2 Ag^+ + 2 OH^-$ progresses, and $Ag^+$ moves to the other one of the two adjacent electrode patterns 11 (cathode), which is the so called "ion migration", and as a result the precipitation of the dendrites of Ag progresses.

However the hollow portion 16 is formed at the bottom end of the area between the terminal metal fittings 13 and 14 in the flange portions 8A and 8B, so even if the distance between the adjacent two electrode patterns 11 is short (e.g. 1 mm or less), the progress of precipitation of the dendrites of Ag due to the migration of $Ag^+$ is suppressed by the hollow portion 16. By this, short circuiting between the adjacent two electrode patterns 11, that is the short circuiting of the terminal metal fittings 13 and 14 is prevented, so the generation of dielectric breakdown of the electronic device 1 can be prevented.

As described above, according to the present embodiment, even if the conductive paste P is intervened between a part of the flange portions 8A and 8B of the drum core 4 and the electrode patterns 11 to increase the bonding strength of the coil component 2 to the electrode patterns 11 when the coil component 2 is mounted on the circuit board 3 using the conductive paste P, short circuiting between the different electrode patterns 11 due to ion migration does not occur. Unlike the case of mounting the coil component 2 on the circuit board 3 using solder, the influence on other components when the coil component 2 is mounted can be decreased. As a result, the reliability of the electronic device 1 can be improved.

Since the mounting strength of the coil component 2 on the circuit board 3 can be sufficiently high, high reliability can be maintained even if the electronic device 1 is mounted in an environment exposed to high vibration, such as an automobile.

Figure 5:
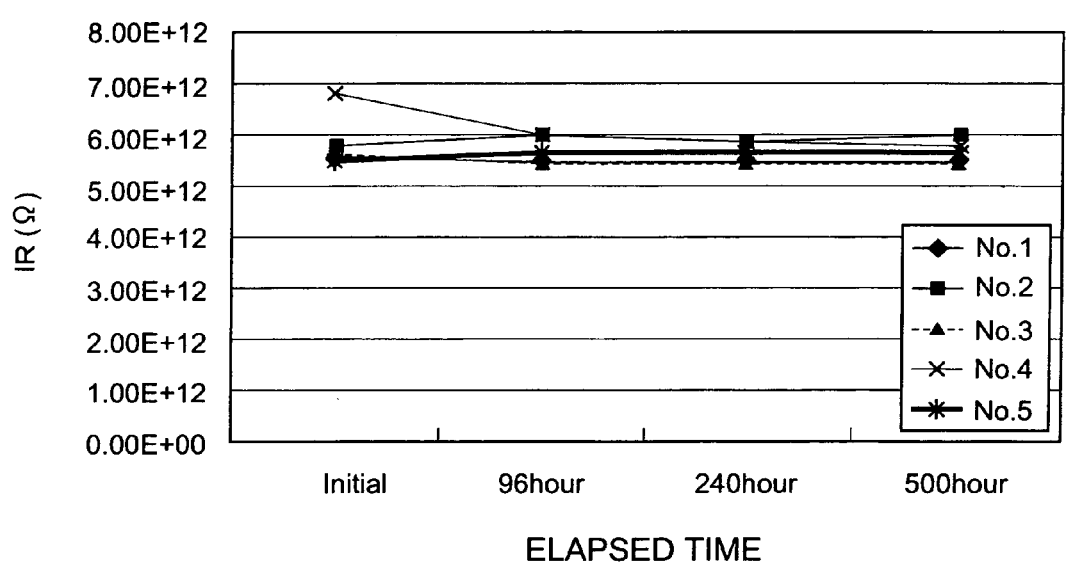
FIG. 5 is a graph depicting the time-based change of insulation resistance in a moisture resistance load test.

FIG. 5 shows a result when the moisture resistance load test is actually performed with the electronic device of the present embodiment. Specifically, five samples are prepared, and the time-based change of the insulation resistance (IR) of each sample is checked under humidity of 85% RH and temperature of 85° C. All samples did not present any major change after 500 hours elapsed when the insulation resistance is a standard 10 MΩ min.

As the experiment result in FIG. 5 shows, when the coil component 2 is mounted on the circuit board 3 in a state where the conductive paste P is intervened between the terminal metal fittings 13 and 14, a part of the flange portions 8A and 8B of the drum core 4 and the electrode patterns 11, short circuiting between the terminal metal fittings 13 and 14 can be prevented by forming the hollow portion 16 at the bottom end of the area between the terminal metal fittings 13 and 14 in the flange portion 8A and 8B.

Second Embodiment

Now, an electronic device 20 according to the second embodiment will be described with reference to FIG. 6-FIG. 11.

Figure 6:
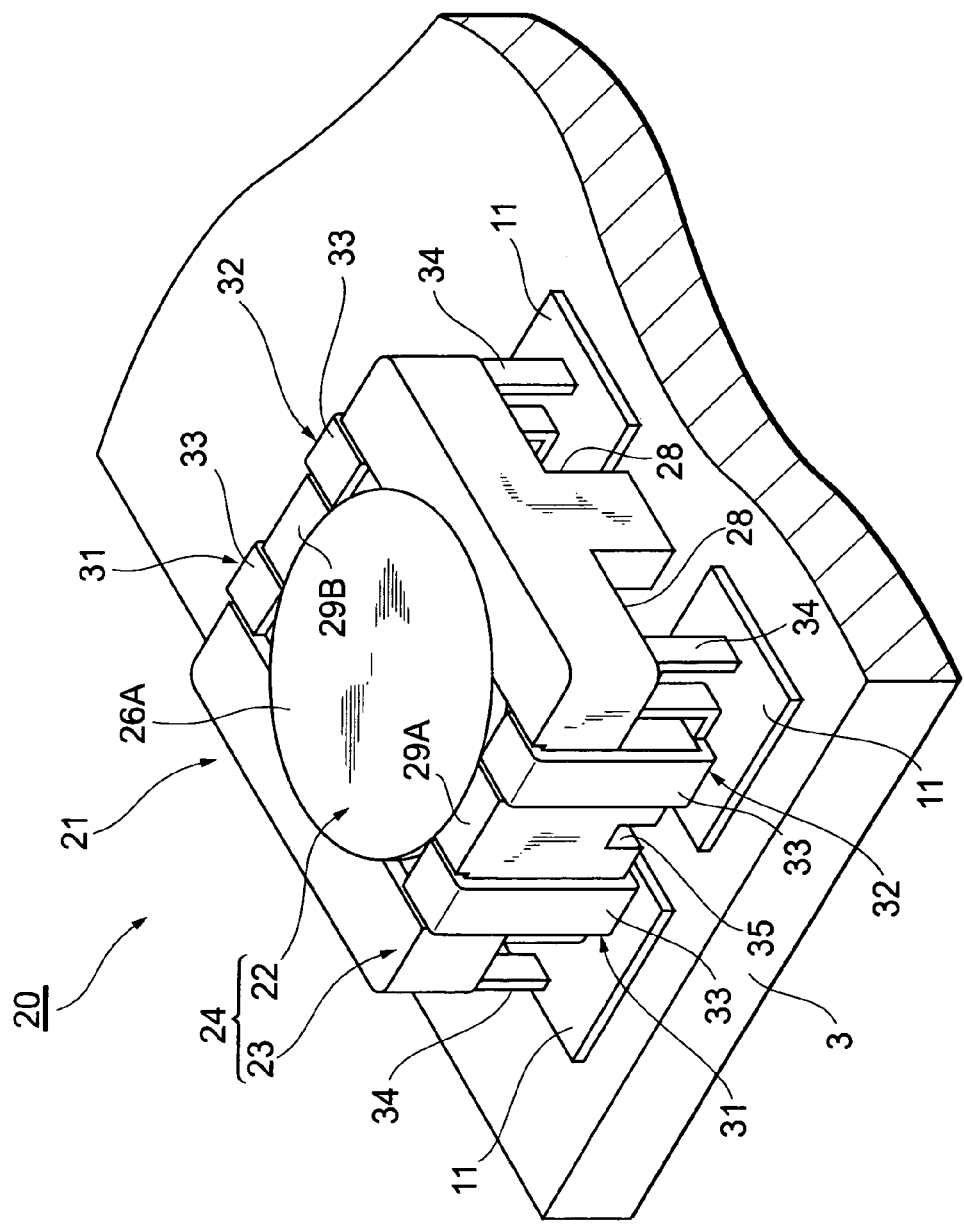
FIG. 6 is a perspective view depicting an electronic device according to the second embodiment.
Figure 7:
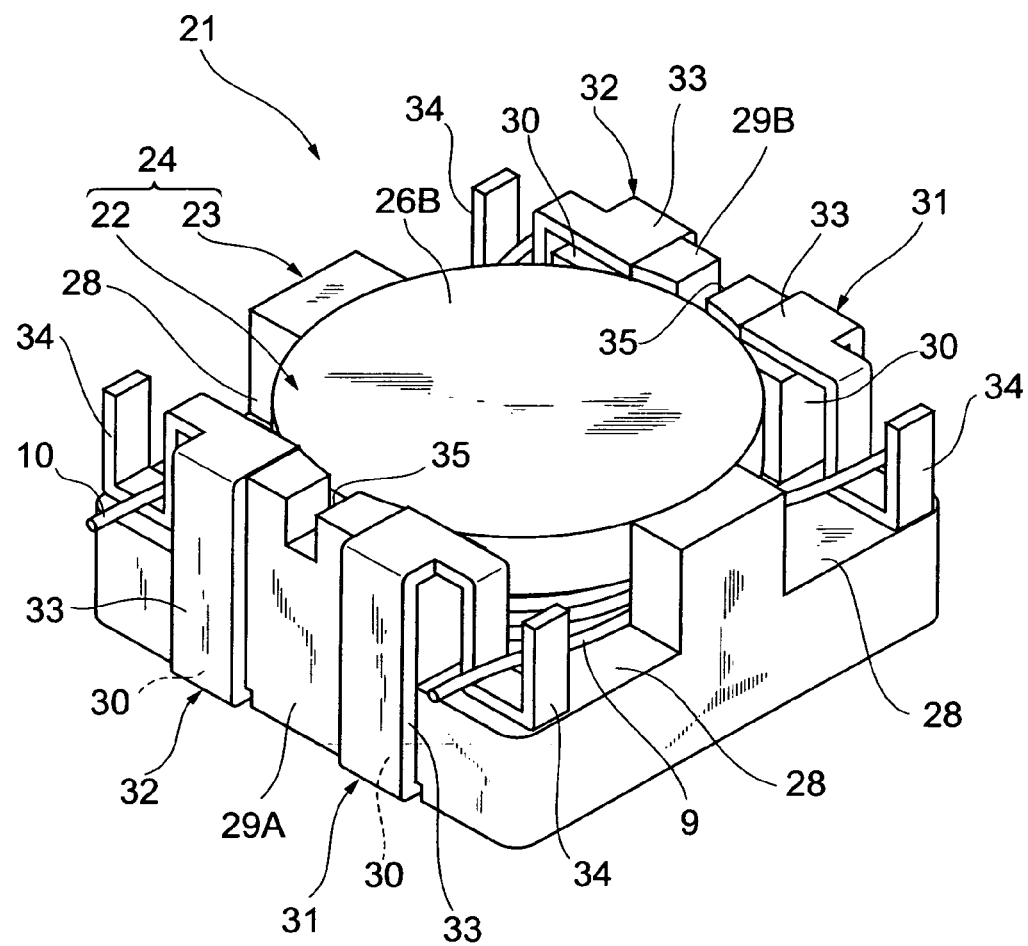
FIG. 7 is a perspective view depicting the coil component shown in FIG. 6.
Figure 8:
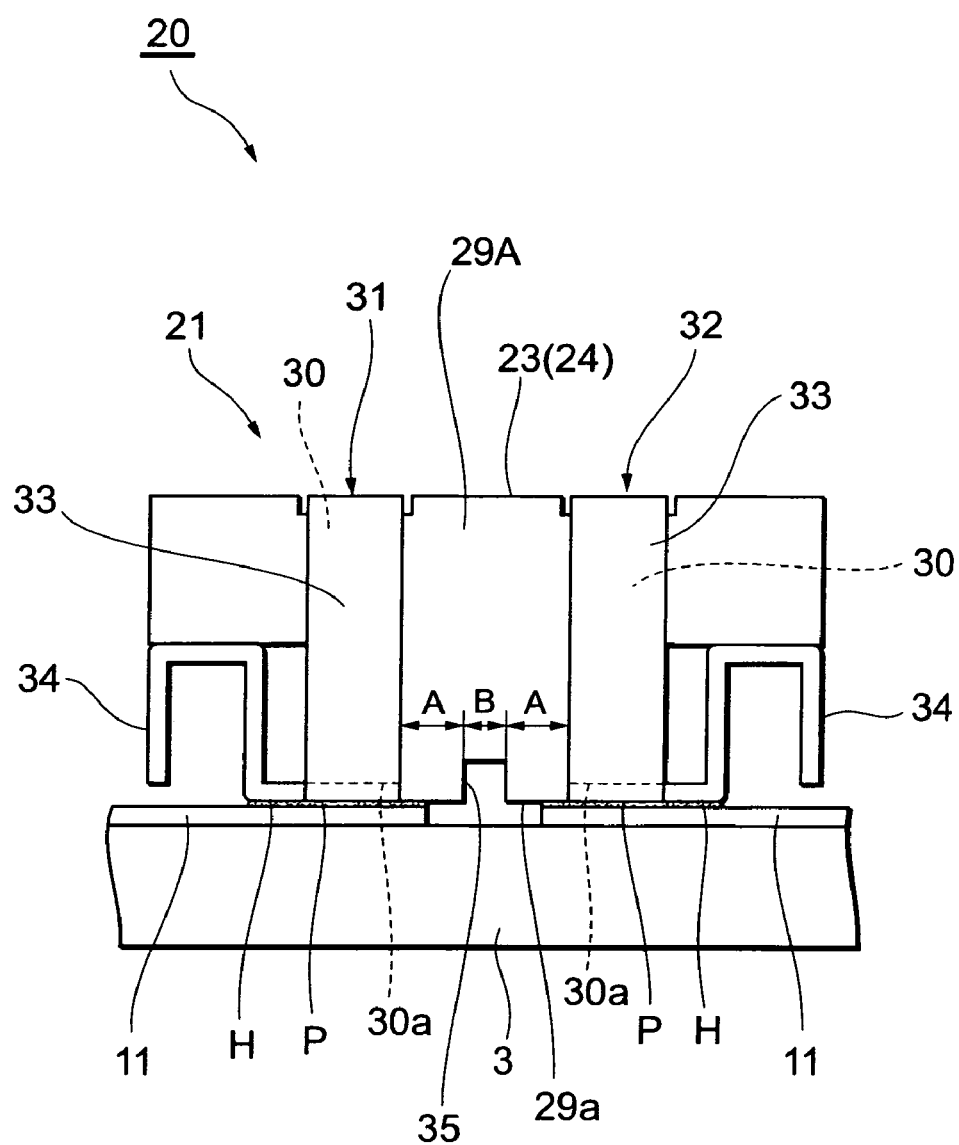
FIG. 8 is a side view depicting the electronic device shown in FIG. 6.

FIG. 6 is a perspective view depicting the electronic device 20 having a coil component according to the second embodiment. FIG. 7 is a perspective view depicting the coil component shown in FIG. 6. FIG. 8 is a side view depicting the electronic device shown in FIG. 6. The electronic device 20 has a coil component 21, instead of the coil component 2 in the first embodiment. The coil component 21 comprises a core element 24 which has a drum core 22 and a ring core 23. The core element 24 has a closed magnetic structure, so the leakage of magnetic flux can be decreased. The material of the core element 24 is the same as that of the core element 6 in the first embodiment.

Figure 9:
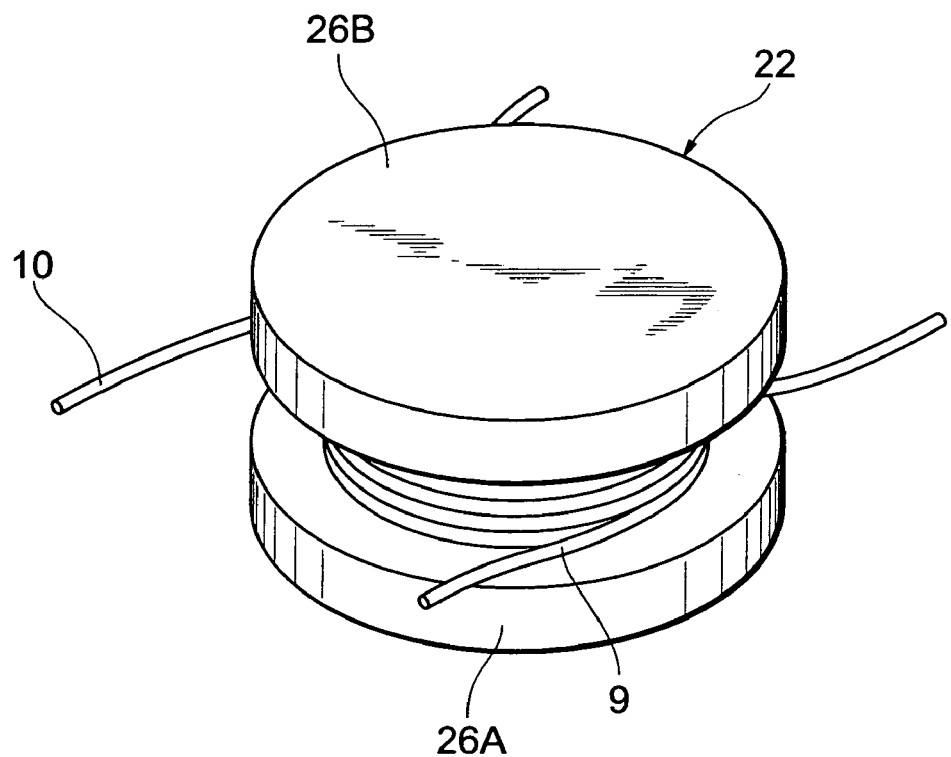
FIG. 9 is a perspective view depicting the state where a coil is wound around the core portion of the drum core shown in FIG. 6.
Figure 10:
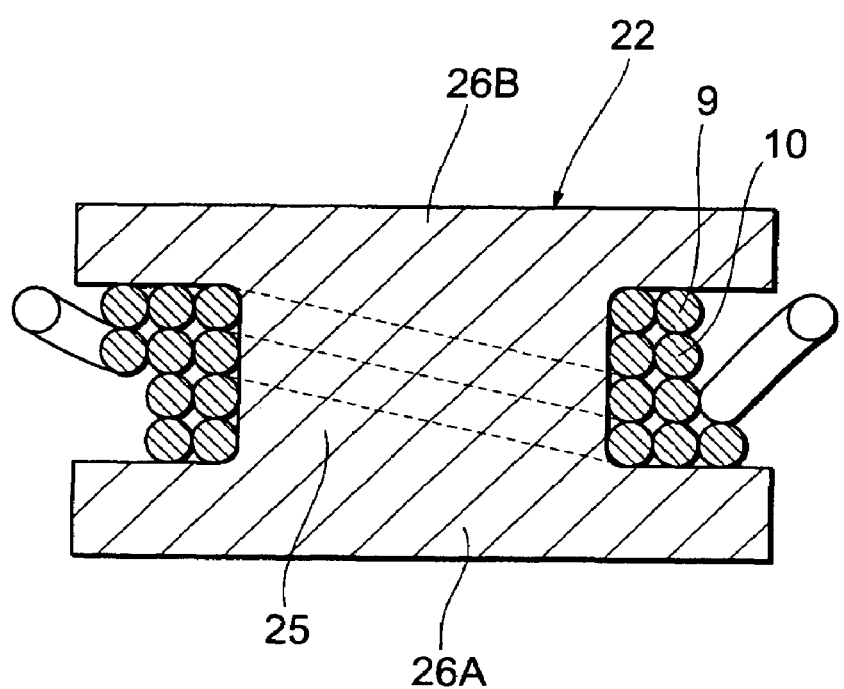
FIG. 10 is a cross-sectional view depicting the drum core shown in FIG. 9.

As FIG. 9 and FIG. 10 show, the drum core 22 has a core portion 25 and a pair of flange portions 26A and 26B disposed on both ends of the core portion 25. The core portion 25 and the flange portions 26A and 26B are integrated. The shape of the core portion 25 is cylindrical, and the flange portions 26A and 26B are disk shaped. In the core portion 25, two coils 9 and 10 are placed. The coils 9 and 10 are wound for a plurality of layers in a direction vertical to the axis of the core portion 25, so that both ends come to the outermost layer in a state where the coils are lined up in the axis direction of the core portion 25, for example.

Figure 11:
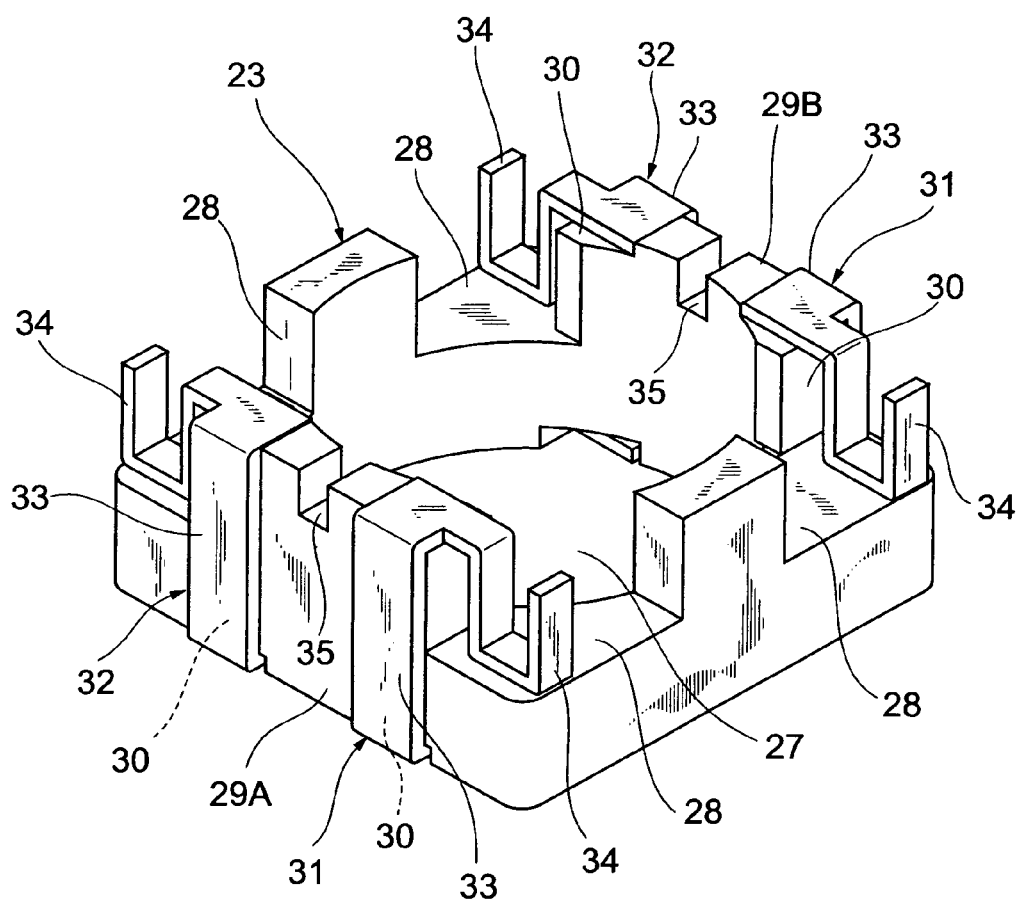
FIG. 11 is a perspective view depicting the ring core shown in FIG. 7.

The ring core 23 is roughly a square core surrounding the drum core 22, as FIG. 11 shows. In the ring core 23, a through hole 27 of which cross-section is a circle is formed so that the drum core 22 is inserted. In the area including four corners of the bottom face of the ring core 23, a notch 28 is formed respectively.

The ring core 23 has a pair of side walls 29A and 29B which face each other and form the notch 28. These side walls 29A and 29B constitute the mounting portion which is bonded to the electrode patterns 11 on the circuit board 3. The side walls 29A and 29B have a terminal forming area 30 on both sides respectively. On one terminal forming area 30 of the side wall 29A and one terminal area 30 of the side wall 29B, a terminal metal fitting 31, to be electrically connected to both ends of the coil 9, is attached respectively. On the other terminal forming area 30 of the side wall 29A and the other terminal forming area 30 of the side wall 29B, a terminal metal fitting 32, to be electrically connected to both ends of the coil 10, is attached respectively.

The terminal metal fittings 31 or 32 have a metal fitting main body portion 33 and connection portion 34. The metal fitting main body portion 33 has roughly a C-shaped cross-section, and is placed in each terminal forming area 30 of the side walls 29A and 29B. The metal fitting main body portion 33 is attached to each terminal forming area 30 of the side walls 29A and 29B by crimping from the top and bottom. A connection portion 34 has roughly a U-shape, and is integrated with the metal fitting main body portion 33. The connection portion 34 is connected with the coils 9 and 10. Each connection portion 34 is structured so as to be placed in the notch 28 of the ring core 23. The material of the terminal metal fittings 31 and 32 is the same as that of the terminal metal fittings 13 and 14 in the first embodiment.

As FIG. 8 shows, it is preferable that the height position of the bottom face (mounting side face) 30a of the terminal forming area 30 of the side wall 29A and 29B is substantially higher than the height position of the bottom face (mounting face) 29a of the area between each terminal forming area 30 in the side walls 29A and 29B by the thickness of the terminal metal fittings 31 and 32. By this, in a state where the terminal metal fittings 31 and 32 are attached to the terminal forming area 30, the bottom face 29a of the area between each terminal forming area 30 in the side wall 29A and 29B and the bottom face (mounting face) H of the terminal metal fittings 31 and 32 substantially form a same plane.

At the bottom end of the area between each terminal forming area 30 in the side walls 29A and 29B, a hollow portion 35 opening to the mounting face 29a is formed. The hollow portion 35 extends in the direction facing the side walls 29A and 29B, and is formed in a shape of a groove of which cross-section is a rectangle. The hollow portion 35 is formed at the center of the side walls 29A and 29B so as to extend from the outer side face to the inner side face of the side walls 29A and 29B. By this, the mounting face 29a of the side walls 29A and 29B exists on both sides of the hollow portion 35. As FIG. 8 shows, when the length from the terminal metal fittings 31 and 32 to the hollow portion 35 is A, and the width of the hollow portion 35 is B in the side walls 29A and 29B, it is preferable to satisfy the relationship of $A/2 \leq B \leq A$.

When the drum core 22 where the coils 9 and 10 are placed is installed in the ring core 23, the drum core 22 is inserted into the through hole 27 from the bottom face side of the ring core 23. And both ends of the coils 9 and 10 are connected to the connection portions 34 of the terminal metal fittings 31 and 32 respectively. After wiring the coils 9 and 10 like this, the adhesive is applied on the top face of the ring core 23 and the flange portion 26A of the drum core 22, so as to integrated and secure the ring core 23 and drum core 22. Then a laser beam is irradiated onto the connection portion 34 of the terminal metal fittings 31 and 32, for example, so as to fuse and connect the coils 9 and 10 and the connection portions 34.

When the coil component 21 structured as above is mounted on the circuit board 3, the conductive paste P is intervened between an area covering the entire mounting face H of the terminal metal fittings 31 and 32 and a part of the mounting faces 29a of the side walls 29A and 29B, and the electrode patterns 11, as shown in FIG. 8.

Since the conductive paste P is used to mount the coil component 21 on the circuit board 3, the mounting strength of the coil component 21 on the circuit board 3 can be increased while decreasing the influence on other components when the coil component 21 is mounted, just like the first embodiment. The hollow portion 35 is formed at the bottom end of the area between the terminal metal fittings 31 and 32 in the side walls 29A and 29B of the drum core 22, so even if the distance between the adjacent electrode patterns 11 is short, the generation of short circuiting between the terminal metal fittings 31 and 32 due to ion migration when the electronic device 20 is ON can be prevented, just like the case of the first embodiment.

Third Embodiment

Now, an electronic device 40 according to the third embodiment will be described with reference to FIG. 12-FIG. 14.

Figure 12:
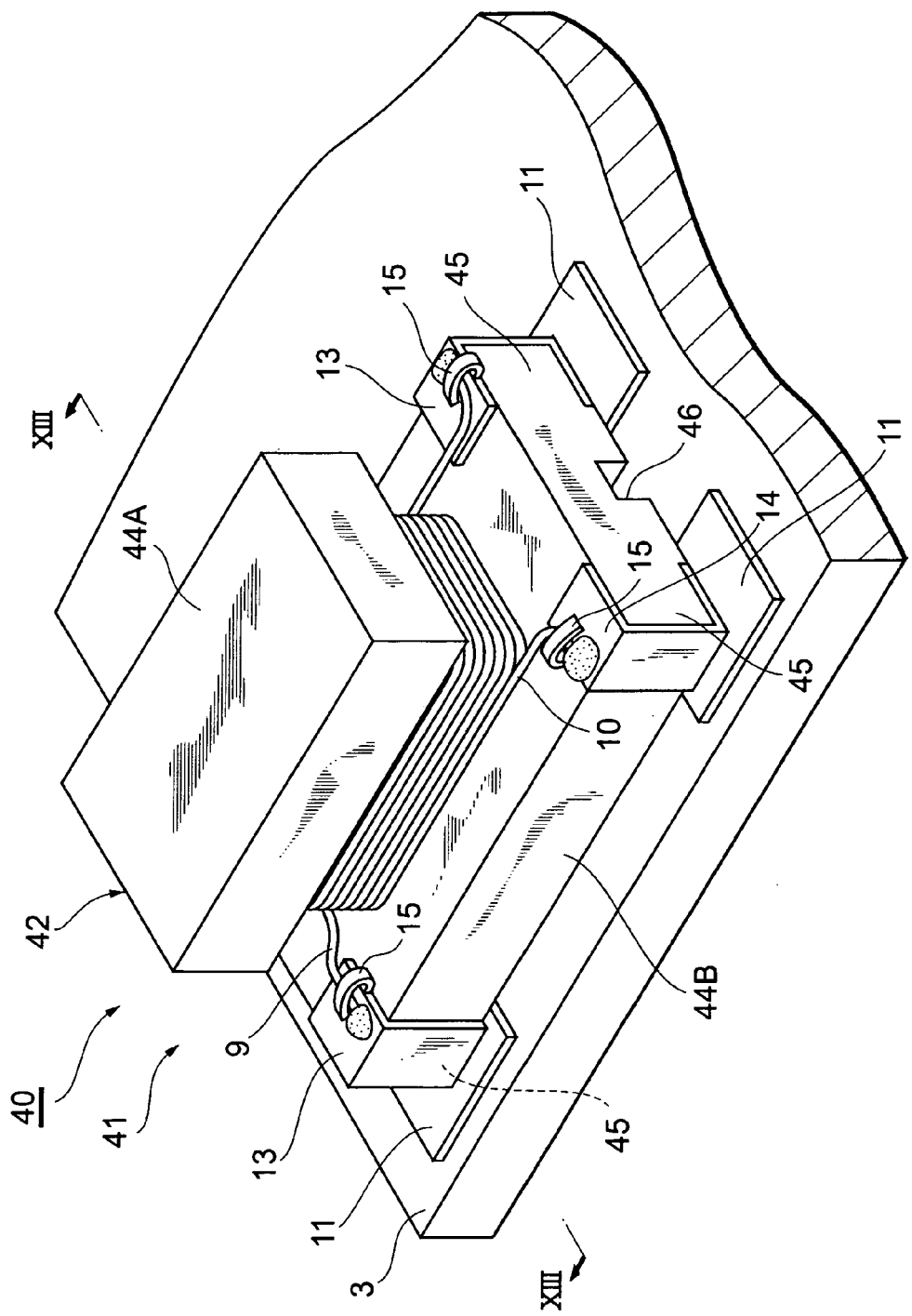
FIG. 12 is a perspective view depicting an electronic device according to the third embodiment.

FIG. 12 is a perspective view depicting the electronic device according to the third embodiment. FIG. 13 is a cross-sectional view sectioned at XIII-XIII in FIG. 12. FIG. 14 is a bottom view depicting the coil component shown in FIG. 12. The electronic device 40 has a coil component 41, in stead of the coil component 2 in the first embodiment. The coil component 41 comprises a core element 42. The material of the core element 42 is the same as that of the core element 6 in the first embodiment.

The core element 42 has a core portion 43 and a top flange portion 44A and bottom flange portion 44B disposed on both ends of the core portion 43. The core portion 43 and the flange portions 44A and 44B are integrated. The shape of the core portion 43 and the flange portions 44A and 44B is a rectangular parallelepiped. The coils 9 and 10 are placed on the core portion 43.

The bottom flange portion 44B has a bigger size than the top flange portion 44A. The bottom flange portion 44B constitutes the mounting portion which is bonded to the electrode patterns 11 on the circuit board 3. On the four corners of the bottom flange portion 44B, a terminal forming area 45 is placed respectively. In the terminal forming area 45, two terminal metal fittings 13 and 14 to be electrically connected to both ends of the coils 9 and 10 are placed respectively.

Figure 13:
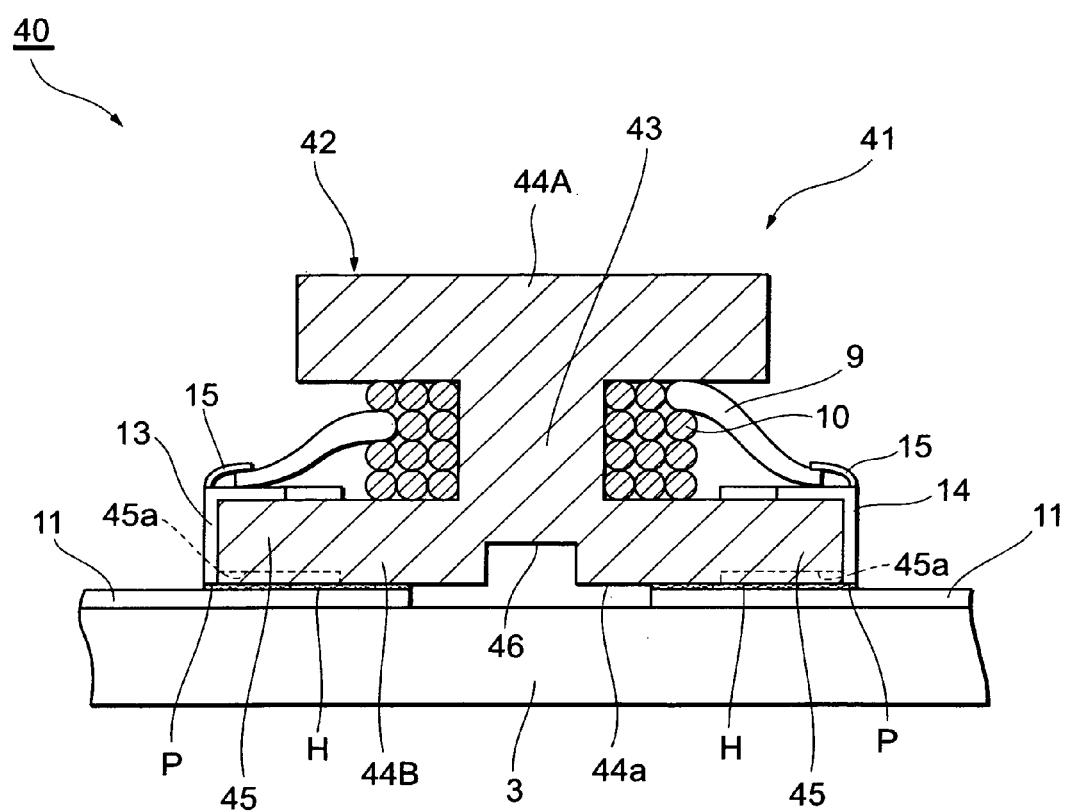
FIG. 13 is a cross-sectional view sectioned at the XIII-XIII line in FIG. 12.
Figure 14:
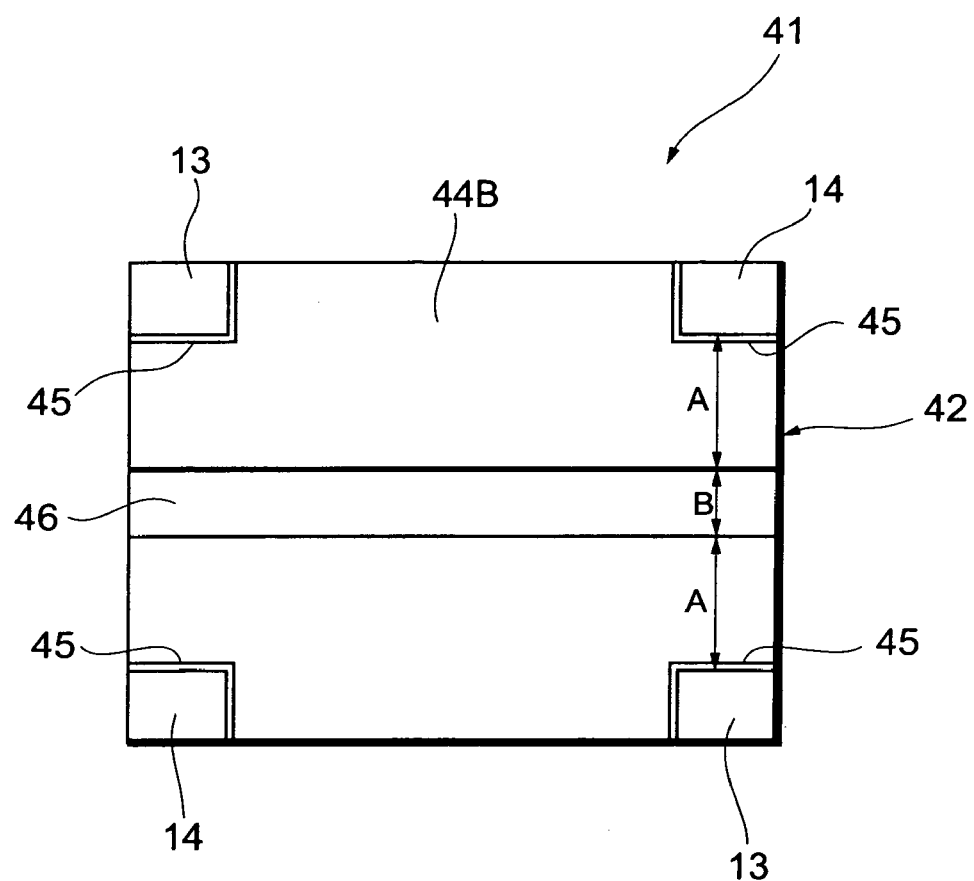
FIG. 14 is a bottom view depicting the coil component shown in FIG. 12.

As FIG. 13 shows, it is preferable that the height position of a bottom face (mounting side face) 45a of the terminal forming area 45 of the bottom flange portion 44B is substantially higher than the height position of a bottom face (mounting face) 44a of the area of the bottom flange portion 44B by the thickness of the terminal metal fittings 13 and 14. By this, in a state where the terminal metal fittings 13 and 14 is attached to the terminal forming area 45, the bottom face 44a of the area of the bottom flange portion 44B excluding each terminal forming area 45 and the bottom face (mounting area) H of the terminal metal fittings 13 and 14 substantially form a same plane.

At the bottom end of the area between each terminal forming area 45 in the bottom flange portion 44B, a hollow portion 46, opening to the bottom face (mounting face) 44a, is formed. The hollow portion 46 is formed in the shape of a groove of which cross-section is a rectangle. The hollow portion 46 is formed at the center of the side perpendicular to the longitudinal direction of the bottom flange portion 44B so as to extend from one end face to the other end face of the bottom flange portion 44B. By this, the mounting face 44a exists on both sides of the hollow portion 46. As FIG. 14 shows, when the length of the plated electrode to the hollow portion in the flange portions A and B is A and the width of the hollow portion is B, it is preferable to satisfy the relationship of $A/2 \leq B \leq A$.

When the coil component 41 structured as above is mounted on the circuit board 3, the conductive paste P is intervened between an area covering the entire mounting face H of the terminal metal fittings 13 and 14 and a part of the mounting face 44a of the bottom flange portion 44B and the electrode patterns 11, as shown in FIG. 13.

Since the conductive paste P is used to mount the coil component 41 on the circuit board 3, the mounting strength of the coil component 41 on the circuit board 3 can be increased while decreasing the influence on other components when the coil component 41 is mounted, just like the first embodiment. The hollow portion 46 is formed at the bottom end of the area between the terminal forming areas 45 in the bottom flange portion 44B, so even if the distance between the adjacent electrode patterns 11 is short, the generation of short circuiting between the terminal metal fittings 13 and 14 due to ion migration when the electronic device 40 is ON can be prevented, just like the case of the first embodiment.

Fourth Embodiment

Now, an electronic device 50 according to the fourth embodiment will be described with reference to FIG. 15-FIG. 18.

Figure 15:
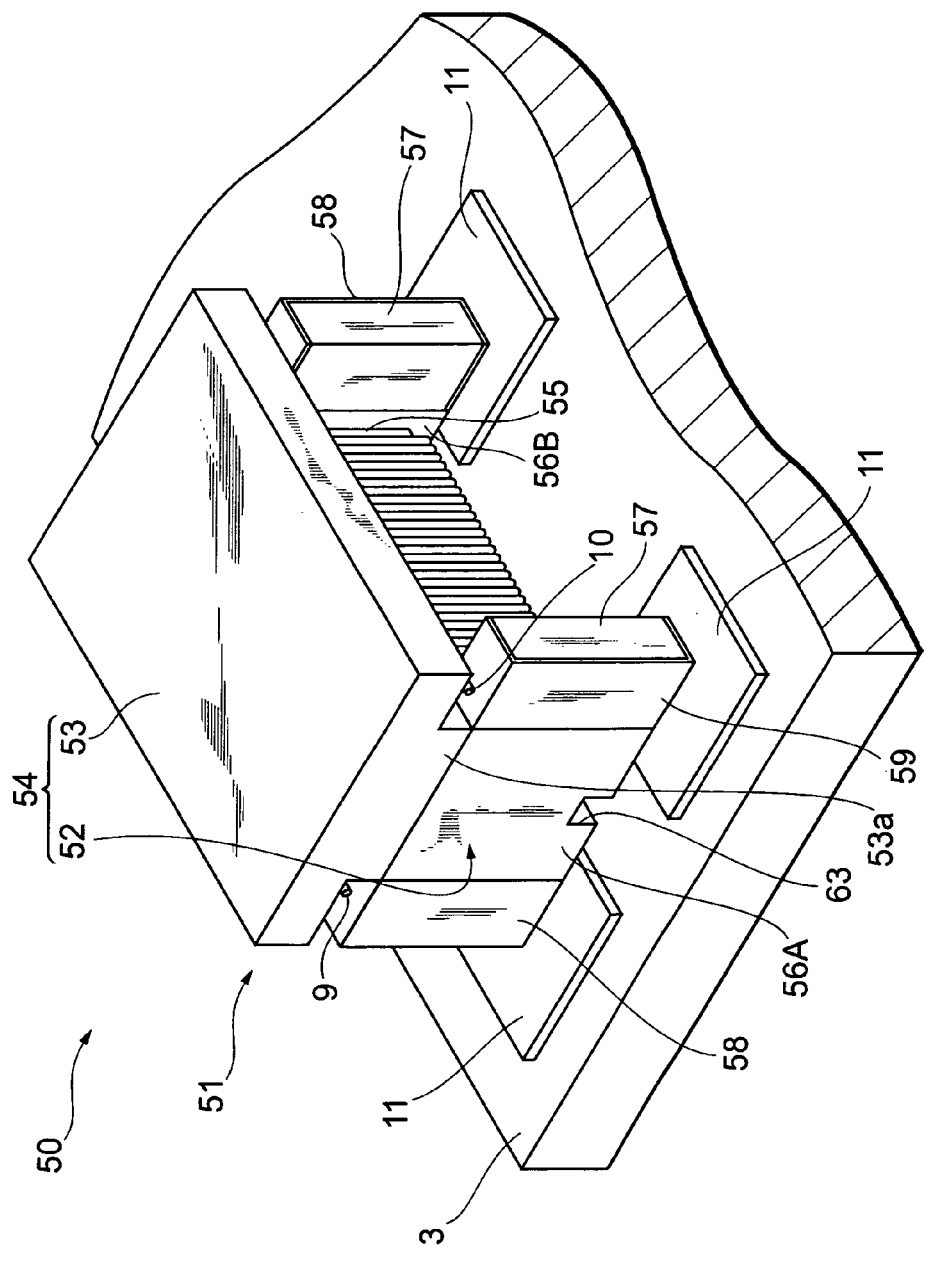
FIG. 15 is a perspective view depicting an electronic device according to the fourth embodiment.
Figure 16:
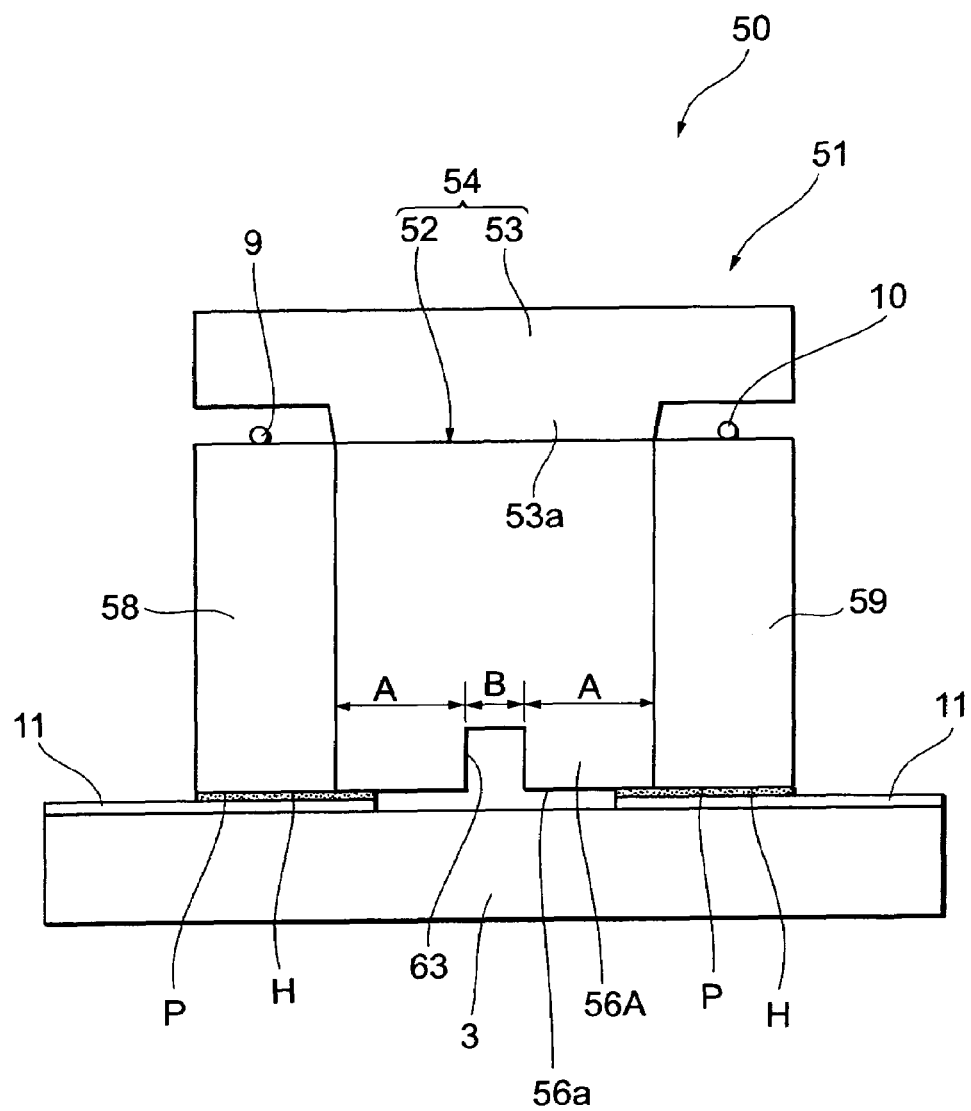
FIG. 16 is a side view depicting the electronic device shown in FIG. 15.

FIG. 15 is a perspective view depicting the electronic device according to the third embodiment. FIG. 16 is a side view depicting the electronic device shown in FIG. 15. The electronic device 50 has a coil component 51, instead of the coil component 2 in the first embodiment. The coil component 51 comprises a core element 54 which has a drum core 52 and a flat core 53. The material of the core element 54 is the same as that of the core element 6 in the first embodiment.

Figure 17:
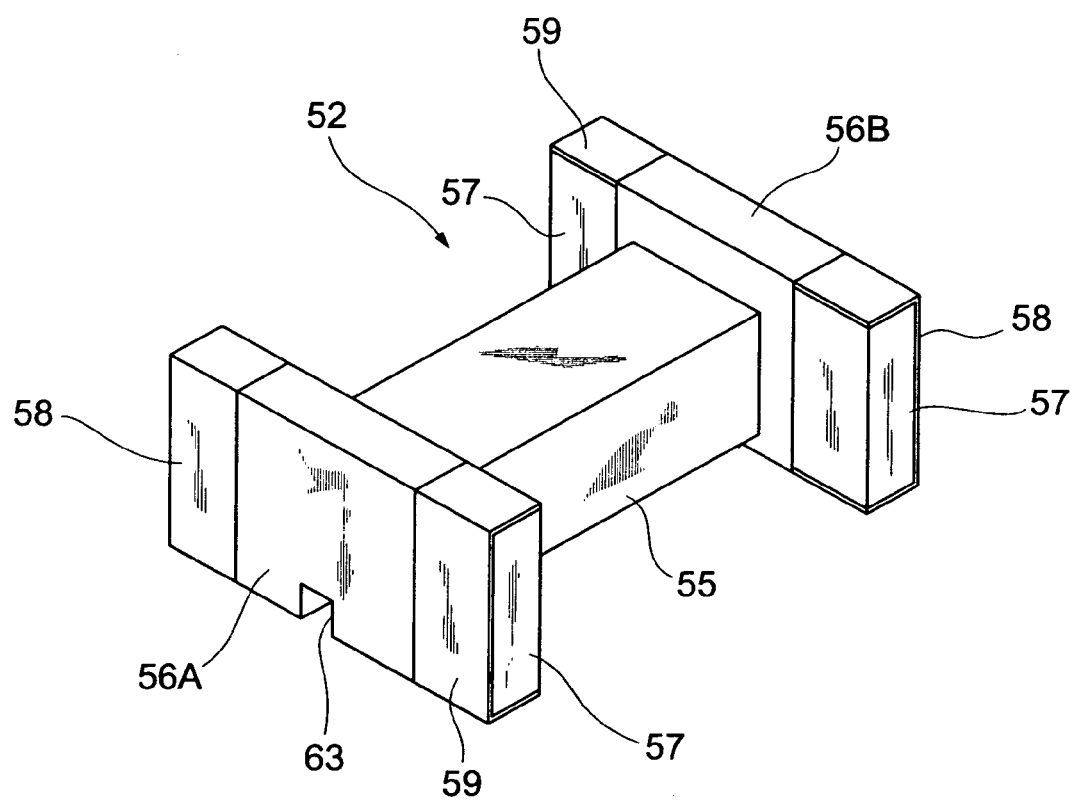
FIG. 17 is a perspective view depicting the drum core shown in FIG. 15.

As FIG. 15-FIG. 17 show, the drum core 52 has a core portion 55 and a pair of flange portions 56A and 56B disposed on both ends of the core portion 55. The core portion 55 and flange portions 56A and 56B are integrated. The shape of the core portion 55 is a quadrangular prism, and the flange portions 56A and 56B are rectangular parallelepipeds. Two coils 9 and 10 are placed on the core portion 55.

The flange portion 56A and 56B have a mounting portion which is bonded to the electrode patterns 11 formed on the circuit board 3. The flange portions 56A and 56B have a terminal forming area 57 at both ends respectively. On one electrode forming area 57 of the flange portion 56A and on one electrode forming area 57 of the flange portion 56B, a plated electrode 58, to be electrically connected with both ends of the coil 9, is positioned respectively. On the other electrode forming area 57 of the flange portion 56A and the other electrode forming area 57 of the flange portion 56B, a plated electrode 59, to be electrically connected with both ends of the coil 10, is positioned respectively.

Figure 18:
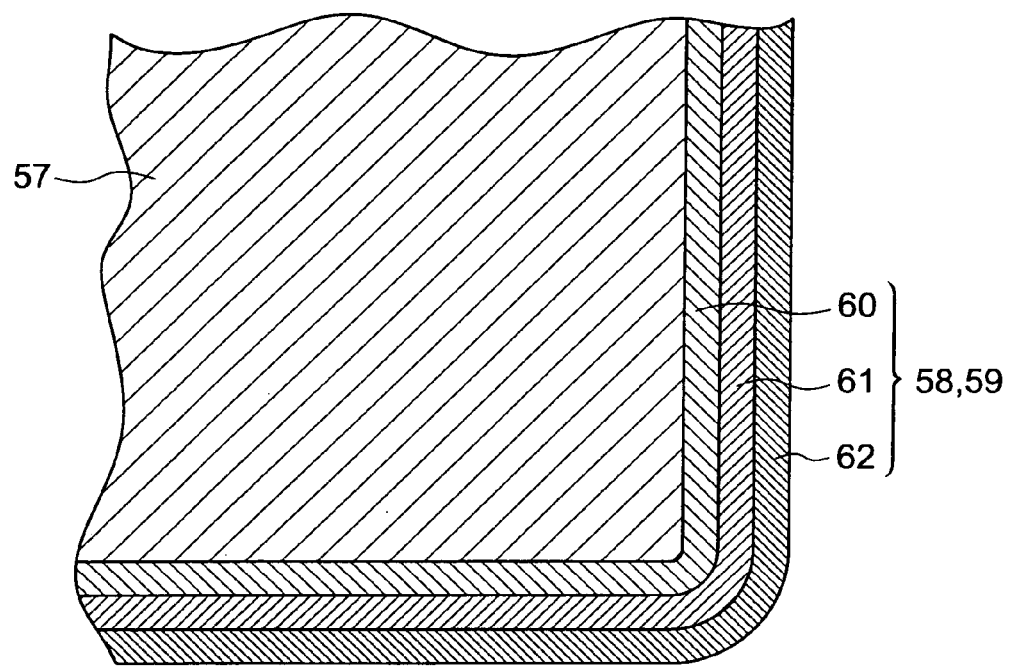
FIG. 18 is an enlarged cross-sectional view depicting the drum core, including the plate electrodes, shown in FIG. 17.

The plated electrodes 58 and 59 are formed roughly to be a C-shape in the cross-section, so as to cover the top face, bottom face and outer side face of the electrode forming area 57. Specifically, as shown in FIG. 18, the plated electrodes 58 and 59 have a three layer structure comprising an Ag baked layer 60 formed on the surface of the electrode forming area 57, a Ni plated layer 61 formed on the Ag baked layer 60, and an Au plated layer 62 formed on the Ni plated layer 61. The thickness of the Ag baked layer 60 is about 10 μm, the thickness of the Ni plate layer 61 is about 2-3 μm, and the thickness of the Au plated layer 62 is about 0.5-1.0 μm. The material to form the outermost layer of the plated electrodes 58 and 59 is not limited to Au, but may be platinum or silver palladium.

By forming the plated electrodes 58 and 59 to be sufficiently thin, the bottom face (mounting face) H of the plated electrodes 58 and 59 and the bottom face (mounting face) 56a of the flange portions 56A and 56B can form roughly a same plane, even if the electrode forming areas 57 of the flange portions 56A and 56B are not especially processed.

Both ends of the coil 9 are electrically connected to the plated electrode 58 in a state where both ends are placed on the plated electrode 58 by thermo compression, for example. Both ends of the coil 10 are electrically connected to the plated electrode 59 in the same way.

At the bottom end of the area between each terminal forming area 57 in the flange portions 56A and 56B, a hollow portion 63, opening to the bottom face (mounting face) 56a, is formed. The hollow portion 63 is formed in the shape of a groove of which the cross-section is a rectangle. The hollow portion 63 is formed at the center of the flange portions 56A and 56B so as to extend from the outer side face to the inner side face of the flange portions 56A and 56B. By this, the mounting face 56a exists on both sides of the hollow portion 63. As FIG. 16 shows, when the length from the plated electrodes 58 and 59 to the hollow portion 63 is A and the width of the hollow portion 63 is B in the flange portions 56A and 56B, it is preferable to satisfy the relationship of $A/2 \leqq B \leqq A$.

The flat core 53 has a protruding portion 53a. The protruding portion 53a is secured to the top face of the drum core 52 by adhesive. Because of this, the core element 54 has a closed magnetic circuit structure.

When the coil component 51 structured as above is mounted on the circuit board 3, the conductive paste P is intervened between an area covering the entire mounting face H of the plated electrodes 58 and 59 and a part of the mounting face 56a of the flange portion 56A and 56B, and the electrode patterns 11, as shown in FIG. 16.

Since conductive paste P is used to mount the coil component 51 on the circuit board 3, the mounting strength of the coil component 51 on the circuit board 3 can be increased while decreasing the influence on other components when the coil component 51 is mounted, just like the first embodiment. Also the hollow portion 63 is formed at the bottom end of the area between the plated electrodes 58 and 59 in the flange portions 56A and 56B of the drum core 52, so even if the distance between the adjacent electrode patterns 11 is short, the generation of short circuiting between the plated electrodes 58 and 59, due to ion migration when the electronic device 50 is ON, can be prevented, just like the case of the first embodiment.

The present invention is not limited to the above embodiments. For example, in the case of the coil components in the above embodiments, the hollow portion 46 is formed to be a groove shape of which cross-section is a rectangle, but the shape of the hollow portion to be formed in the core element is not limited to this, but may have a semi circle or V-shaped cross-section. The number of hollow portions to be formed in the core element is not limited to the above either.

In the fourth embodiment, the terminal electrodes are not terminal metal fittings, but are plated electrodes in the same type of coil component as the first embodiment, but the terminal electrodes may be plated electrodes also in the same type of coil component as the second and third embodiments.

The coil components of the above embodiments comprise a core portion of the core element and two coils wound thereon, but the present invention is not limited to this, but may be applied to the core portion of the core element on which one or three or more coils are wound. The present invention can also be applied to coil components having a structure other than the core portion of the core element on which coils are wound, such as a coil component having a structure of a core element on which thin film coil conductors are layered.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following Claims.

What is claimed is:

1. A coil component, comprising:
   a core element having a mounting portion;
   at least one coil conductor placed on said core element; and
   at least two terminal electrodes which are placed in said mounting portion and are electrically connected to said at least one coil conductor, wherein
   said mounting portion has at least two terminal placement areas for placing said at least two terminal electrodes, and a hollow portion opening to a mounting side face of said mounting portion is formed in an area between said at least two terminal placement areas in said mounting portion, and
   if a length from said terminal electrode to said hollow portion is A and a width of said hollow portion in said mounting portion is B, a relationship $A/2 \leqq B \leqq A$ is satisfied.

2. The coil component according to claim 1, said core element further comprising a core portion fixed to said mounting portion, and said coil conductor is a coil wound around said core portion.

3. The coil component according to claim 2, wherein said core element has a pair of flange portions positioned at both ends of said core portion, and said pair of flange portions constitute said mounting portion.

4. The coil component according to claim 2, wherein said core element has an upper flange portion and a lower flange portion which are positioned at both ends of said core portion, and said lower flange portion constitutes said mounting portion.

5. The coil component according to claim 1, wherein a height position on a mounting side face of said terminal placement area in said mounting portion is substantially higher than a height position of a mounting side face of an area between said at least two terminal placement areas in said mounting portion, by a thickness of said terminal electrode.

6. The coil component according to claim 1, wherein said terminal electrode is a terminal metal fitting which is attached in a terminal placement area of said mounting portion.

7. The coil component according to claim 1, wherein said terminal electrode is a plated electrode formed on a surface of said terminal placement area of said mounting portion.

8. The coil component according to claim 1, wherein an outermost layer of said at least two terminal electrodes is an Au plated layer.

9. A coil component, comprising:
   a core element having a mounting portion;
   at least one coil conductor placed on said core element; and
   at least two terminal electrodes which are placed in said mounting portion and are electrically connected to said at least one coil conductor, wherein
   said mounting portion has at least two terminal placement areas for placing said at least two terminal electrodes, and a hollow portion opening to a mounting side face of said mounting portion is formed in an area between said at least two terminal placement areas in said mounting portion, said core element further comprising:
   a first core which has a core portion and a pair of flange portions positioned at both ends of said core portion; and
   a second core positioned so as to surround said first core, and said second core constitutes said mounting portion.

10. The coil component according to claim 9, wherein said core portion is fixed to said mounting portion, and said coil conductor is a coil wound around said core portion.

11. An electronic device, comprising:
    a circuit board; and
    a coil component which is mounted on said circuit board by conductive paste, said coil component comprising:
    a core element having a mounting portion;

at least one coil conductor placed on said core element; and at least two terminal electrodes which are placed in said mounting portion and are electrically connected to said at least one coil conductor, wherein said mounting portion has at least two terminal placement areas for placing said at least two terminal electrodes, and a hollow portion opening to a mounting side face of said mounting portion is formed in an area between said at least two terminal placement areas in said mounting portion;

said core element further comprising a first core which has a core portion and a pair of flange portions positioned at both ends of said core portion, and a second core positioned so as to surround said first core, and said second core constitutes said mounting portion.

12. An electronic device, comprising:

a circuit board; and a coil component which is mounted on said circuit board by conductive paste, said coil component comprising:

a core element having a mounting portion;

at least one coil conductor placed on said core element; and at least two terminal electrodes which are placed in said mounting portion and are electrically connected to said at least one coil conductor, wherein said mounting portion has at least two terminal placement areas for placing said at least two terminal electrodes, a hollow portion opening to a mounting side face of said mounting portion is formed in an area between said at least two terminal placement areas in said mounting portion, and if a length from said terminal electrode to said hollow portion is A and a width of said hollow portion in said mounting portion is B, a relationship $A/2 \leqq B \leqq A$ is satisfied.

* * * * *